United States Patent
Go et al.

(10) Patent No.: US 10,009,999 B2
(45) Date of Patent: Jun. 26, 2018

(54) PRINTED CIRCUIT BOARD AND DISPLAY DEVICE HAVING THE SAME

(71) Applicant: Samsung Display Co., Ltd., Yongin-si, Gyeonggi-do (KR)

(72) Inventors: Jeonghun Go, Asan-si (KR); Hyo-chul Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 9 days.

(21) Appl. No.: 15/232,719

(22) Filed: Aug. 9, 2016

(65) Prior Publication Data

US 2017/0202085 A1     Jul. 13, 2017

(30) Foreign Application Priority Data

Jan. 8, 2016 (KR) .................. 10-2016-0002742

(51) Int. Cl.
 *H05K 7/10* (2006.01)
 *H05K 7/12* (2006.01)
 (Continued)

(52) U.S. Cl.
 CPC ............ *H05K 1/18* (2013.01); *H05K 1/0296* (2013.01); *H05K 1/111* (2013.01); *H05K 1/147* (2013.01); *H05K 3/0097* (2013.01); *H05K 2201/09063* (2013.01); *H05K 2201/09236* (2013.01); *H05K 2201/09272* (2013.01); *H05K 2201/10136* (2013.01); *H05K 2201/10409* (2013.01)

(58) Field of Classification Search
 CPC ...... H05K 1/0296; H05K 1/111; H05K 1/147; H05K 1/18; H05K 2201/09063; H05K 2201/09236; H05K 2201/09272; H05K 2201/10136; H05K 2201/10409; H05K 3/0097

See application file for complete search history.

(56) References Cited

U.S. PATENT DOCUMENTS 8,613,522 B2 * 12/2013 Kang ................... H01R 12/721
                                                    362/225
2009/0107714 A1 *  4/2009 Ogasawara .......... H05K 1/0271
                                                    174/260

(Continued)

FOREIGN PATENT DOCUMENTS

KR    10-2006-0009962 A    2/2006
KR       20060009962   *   2/2006
(Continued)

*Primary Examiner* — Yuriy Semenenko
(74) *Attorney, Agent, or Firm* — Lewis Roca Rothgerber Christie LLP (57) ABSTRACT

Provided is a printed circuit board and a display device having the same. The printed circuit board includes a base substrate including a first outline that extends in a first direction and a second outline facing the first outline, the base substrate having a first area, a second area, and a third area successively defined thereon in the first direction and a pad part disposed on the second area. A central outline of the second outline which overlaps the second area has a stepped shape that gradually decreases in distance between the central outline and the first outline from a first point of the central outline contacting the first area to a second point of the central outline contacting the third area.

19 Claims, 6 Drawing Sheets

(51) Int. Cl.
*H05K 1/18* (2006.01)
*H05K 1/11* (2006.01)
*H05K 1/02* (2006.01)
*H05K 1/14* (2006.01)
*H05K 3/00* (2006.01)

(56) References Cited

U.S. PATENT DOCUMENTS

| | | | | |
|---|---|---|---|---|
| 2009/0279281 A1* | 11/2009 | Chung | ............. | G02F 1/133608 |
| | | | | 362/97.1 |
| 2010/0073908 A1* | 3/2010 | Bae | .................. | G02F 1/133604 |
| | | | | 362/97.1 |
| 2010/0195312 A1* | 8/2010 | Ko | .................. | G02F 1/133608 |
| | | | | 362/97.1 |
| 2012/0146520 A1* | 6/2012 | Liu | ..................... | G09G 3/3406 |
| | | | | 315/192 |
| 2014/0028535 A1* | 1/2014 | Min | ........................ | G09G 3/18 |
| | | | | 345/87 |
| 2015/0219941 A1* | 8/2015 | Choi | ................ | G02F 1/133308 |
| | | | | 349/61 |

FOREIGN PATENT DOCUMENTS

KR        10-1387231 B1    4/2014
KR   10-2016-0074843 A    6/2016

* cited by examiner

PRINTED CIRCUIT BOARD AND DISPLAY DEVICE HAVING THE SAME

CROSS-REFERENCE TO RELATED APPLICATION

This application claims priority to and the benefit of Korean Patent Application No. 10-2016-0002742, filed on Jan. 8, 2016, the entire contents of which are hereby incorporated by reference.

BACKGROUND

1. Field

The present disclosure herein relates to a printed circuit board and a display device including the same, and for example, to a printed circuit board and a display device having improved productivity.

2. Description of the Related Art

Display devices include display panels, printed circuit boards (PCB) driving the display panels, and tape carrier packages electrically coupling (e.g., electrically connecting) the display panels to the PCBs. In general, the PCB may be provided in plurality on a base plate, and the plurality of PCBs may be cut out from the base plate. As the number of the PCBs obtained from the base plate increases, manufacturing costs of PCBs may be reduced.

SUMMARY

The present disclosure provides a printed circuit board and a display device having improved productivity.

An embodiment of the present disclosure provides a printed circuit board including: a base substrate including a first outline that extends in a first direction and a second outline facing the first outline, the base substrate having a first area, a second area, and a third area successively defined thereon in the first direction; and a pad part disposed on the second area, wherein a central outline of the second outline which overlaps the second area has a stepped shape that gradually decreases in distance between the central outline and the first outline from a first point of the central outline contacting the first area to a second point of the central outline contacting the third area.

In an embodiment, the central outline may include: a first side extending from the first point in the first direction; a second side extending from the first side in a second direction approaching the first outline; a third side extending from the second side in the first direction; a fourth side extending from the third side in a third direction approaching the first outline; a fifth side extending from the fourth side in the first direction; a sixth side extending from the fifth side in a fourth direction approaching the first outline; and a seventh side extending from the sixth side toward the second point in the first direction.

In an embodiment, the second direction may be aligned with the fourth direction.

In an embodiment, a sum of a first distance between the first side and the first outline and a second distance between the seventh side and the first outline may be equal to that of a third distance between the third side and the first outline and a fourth distance between the fifth side and the first outline.

In an embodiment, the second outline may have a point symmetric shape with respect to a central point that is a center of the fourth side.

In an embodiment, the base substrate may further include: a third outline coupling (e.g., connecting) the first outline to the second outline; and a fourth outline facing the third outline to couple (e.g., connect) the first outline to the second outline, wherein a distance between the central point and the third outline may be equal to that between the central point and the fourth outline.

In an embodiment, a sum of a minimum distance between the first outline and the second outline and a maximum distance between the first outline and the second outline may be twice a distance between the central point and the first outline.

In an embodiment, a hole may be defined between the third side and the first outline of the base substrate.

In an embodiment, a first width that is in parallel (e.g., substantially in parallel) with the first direction on the first area may be equal to a second width that is in parallel (e.g., substantially in parallel) with the first direction on the third area.

In an embodiment, the central outline may include: a first side extending from the first point in the first direction; a second side extending from the first side in a second direction approaching the first outline; a third side extending from the second side in the first direction; a fourth side extending from the third side in a third direction approaching the first outline; and a fifth side extending from the fourth side toward the second point in the first direction.

In an embodiment, the second outline may have a point symmetrical shape with respect to a central point that is a center of the third side.

In an embodiment, a sum of a minimum distance between the first outline and the second outline and a maximum distance between the first outline and the second outline may be twice a distance between the central point and the first outline.

In embodiments of the present disclosure, a display device includes: a display panel configured to display an image; a printed circuit board including a first outline that extends in a first direction and a second outline that faces the first outline, the printed circuit board having a first area, a second area, and a third area successively defined thereon in the first direction; and a plurality of tape carrier packages configured to cover a portion of the first outline, the plurality of tape carrier packages electrically coupling (e.g., electrically connecting) the printed circuit board to the display panel, wherein a central outline of the second outline which overlaps the second area has a stepped shape that gradually decreases in distance between the central outline and the first outline from a first point of the central outline contacting the first area to a second point of the central outline contacting the third area.

In an embodiment, the plurality of tape carrier packages may be provided in odd numbers, and at least one of the plurality of tape carrier packages is attached to the second area of the printed circuit board.

In an embodiment, the central outline may include: a first side extending from the first point in the first direction; a second side extending from the first side in a second direction approaching the first outline; a third side extending from the second side in the first direction; a fourth side extending from the third side in a third direction approaching the first outline; a fifth side extending from the fourth side in the first direction; a sixth side extending from the fifth side in a fourth direction approaching the first outline; and a seventh side extending from the sixth side toward the second point in the first direction.

In an embodiment, the second outline may have a point symmetrical shape with respect to a central point that is a center of the fourth side.

In an embodiment, a sum of a minimum distance between the first outline and the second outline and a maximum distance between the first outline and the second outline may be twice a distance between the central point and the first outline.

In an embodiment, the display device may further include a driving chip disposed on one surface of each of the plurality of tape carrier packages, and wherein the printed circuit board may further include a control part disposed on the first area to generate a control signal for driving the driving chip.

BRIEF DESCRIPTION OF THE DRAWINGS

The accompanying drawings are included to provide a further understanding of embodiments of the present disclosure, and are incorporated in and constitute a part of this specification. The drawings illustrate exemplary embodiments of the present disclosure and, together with the description, serve to explain principles of embodiments of the present disclosure. In the drawings.

DETAILED DESCRIPTION

The subject matter of the present disclosure may be embodied in different forms, and thus, certain embodiments are exemplarily illustrated in the drawings and described in the present disclosure. However, the subject matter of the present disclosure is not limited to the specifically-listed embodiments and statuses, and it should be understood to be intended to include the structural and functional equivalents of the disclosed subject matter. Also, in the drawings, detailed illustrations irrelevant to the present disclosure will not be provided in order to avoid making the subject matter of the present disclosure unclear. Like reference numerals refer to like elements throughout.

Figure 1:
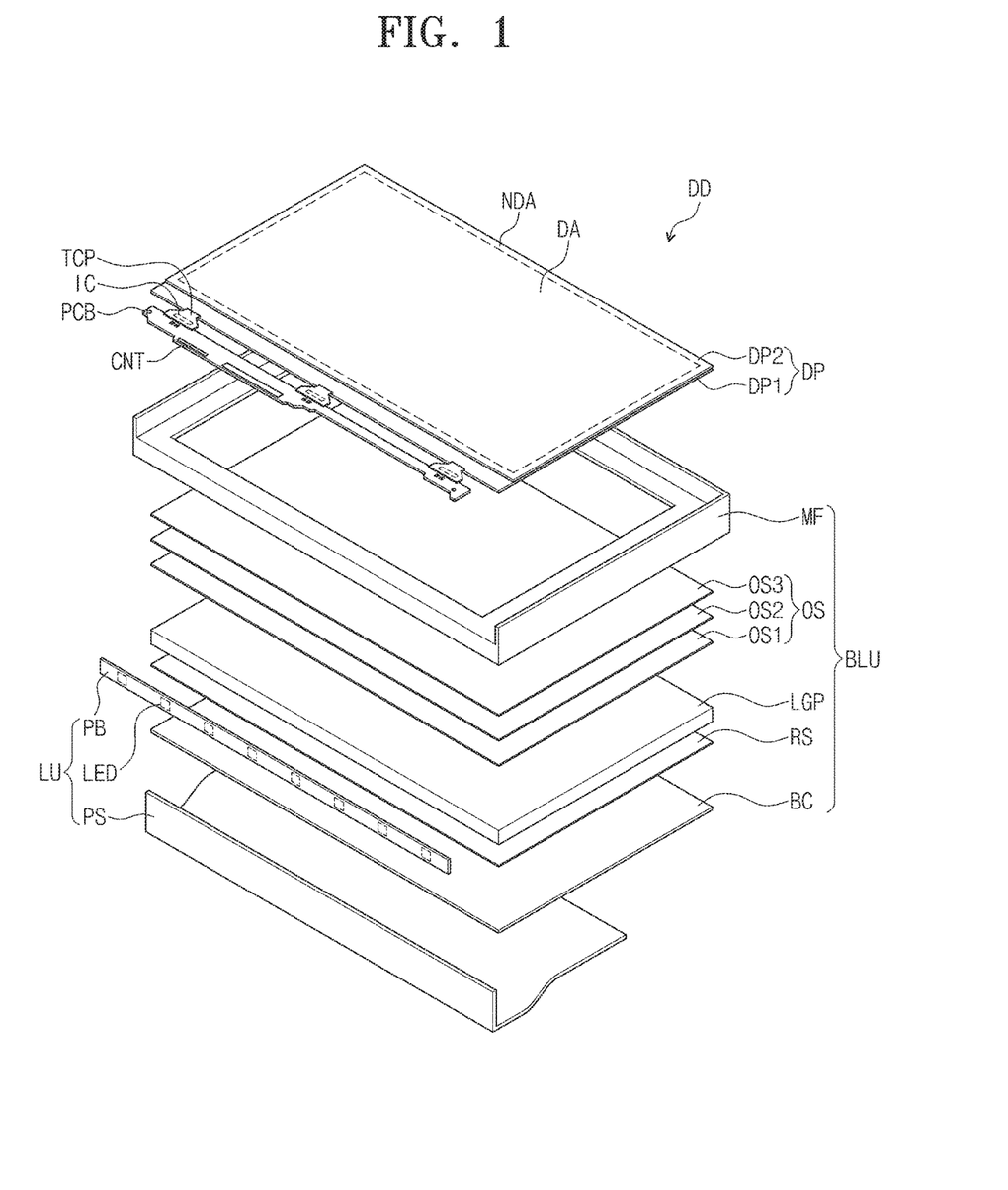
FIG. 1 is an exploded perspective view of a display device according to an embodiment of the present disclosure.

FIG. 1 is an exploded perspective view of a display device according to an embodiment of the present disclosure.

Referring to FIG. 1, a display device DD may include a display panel DP, a printed circuit board PCB, a tape carrier package TCP, and a backlight unit BLU.

The display device DD may be applied to various suitable electronic devices such as, for example, electronic devices like televisions, outdoor billboards, monitors, personal computers (PCs), and laptop computers and small and medium electronic devices like center information displays (CIDs) provided in vehicles, watch-type electronic devices (e.g., watch kind of electronic devices), personal digital assistants (PDAs), portable multimedia players (PMPs), game machines, tablet PCs, smartphones, vehicle navigation units, and cameras. The above-described electronic devices are provided only for explaining certain exemplary embodiments, and thus, embodiments of the present disclosure may be adapted by or applied to other electronic devices without departing from the spirit and scope of the present disclosure.

The display panel DP generates an image corresponding to an inputted image data. The display panel DP according to the current embodiment, however, will not be specifically limited thereto. For example, the display panel DP may be adopted or provided as various suitable types (or kinds) of panels selected from, for example, a liquid crystal display panel, an organic electroluminescence display panel, a plasma display panel, an electrophoretic display panel, and an electrowetting display panel. In the current embodiment, for example, the display panel DP is a liquid crystal display (LCD) panel. The display device DD of FIG. 1 is an example of a display device DD to which the PCB is applied, and the PCB is not be limited thereto.

The display panel DP may include a first substrate DP1, a second substrate DP2 facing the first substrate DP1, and a liquid crystal layer disposed between the first substrate DP1 and the second substrate DP2. The liquid crystal layer may include a plurality of liquid crystal molecules that are changed in arrangement (e.g., rearranged or reoriented) depending on electric fields generated between the first substrate DP1 and the second substrate DP2. In some embodiments, a pair of polarization plates may be disposed on respective upper and lower portions of the display panel DP.

A plurality of tape carrier packages TCP may be disposed on at least one side (e.g., edge) of the first substrate DP1. A driving chip IC may be disposed on each of the plurality of tape carrier packages TCP. The driving chip IC may generate a data signal to be applied to a data line of the display panel DP in response to an external signal.

The printed circuit board PCB may supply the external signal to the driving chip IC. The printed circuit board PCB may be electrically coupled (e.g., electrically connected) to the display panel DP by the tape carrier package TCP. In the current embodiment, the tape carrier package TCP may be provided in odd numbers (e.g., odd numbers of the tape carrier package TCP may be provided). For example, three of the tape carrier package TCP are shown in FIG. 3. Thus, any one of the tape carrier packages TCP may be attached to a center of the printed circuit board PCB. The printed circuit board PCB will be described in more detail with reference to FIGS. 2 and 3.

The display panel DP may have a display surface including a display area DA and a non-display area NDA. The display area DA refers to an area that displays an image, and the non-display area NDA refers to an area that surrounds a periphery of the display area DA and that is not designed to display an image.

The backlight unit BLU may include a middle frame MF, a light guide plate LGP, a light source unit LU, optical sheets OS, and a bottom chassis BC.

The middle frame MF is disposed under the display panel DP. The middle frame MF may support the non-display area NDA of the display panel DP. In some embodiments, an adhesion member may be disposed between the middle frame MF and the non-display area NDA of the display panel DP.

The light source unit LU may be disposed on one side of the light guide plate LGP. The light source unit LU may include a light source LED, a printed circuit board PB, and an extrusion bar PS. The light source LED may be mounted on the printed circuit board PB to receive a driving voltage from the printed circuit board PB. The light source LED receiving the driving voltage may provide light to the light guide plate LGP. The extrusion bar PS may be disposed on a rear surface of the printed circuit board PB to extract (e.g., extrude) heat generated from the light source LED to the outside. The extrusion bar PS may be omitted.

The light guide plate LGP may receive the light from the light source LED to guide the received light toward the display panel DP. A material forming the light guide plate LGP will not be limited to a specific material, and may be any suitable material generally available in the art. For example, the material forming the light guide plate LGP may include at least selected from polyamide (PA), polymethyl methacrylate (PMMA), methyl methacrylate-styrene (MS), and polycarbonate (PC).

In the current embodiment, for example, the light source LED is disposed on one side surface of the light guide plate LGP to provide light, however, the light source LED will not be limited thereto. For example, in another embodiment of the present disclosure, the light source LED may be disposed not only on one side surface of the light guide plate LGP but also on another side surface of the light guide plate LGP. In further another embodiment of the present disclosure, the light source LED may be disposed under the display panel DP to provide light to the display panel DP, and, in some embodiments, the light guide plate LGP may be omitted.

The optical sheets OS may be disposed between the light guide plate LGP and the display panel DP. The optical sheets OS may control a path of the light guided by the light guide plate LGP.

The optical sheets OS may include a diffusion sheet OS1, a prism sheet OS2, and a protection sheet OS3. The diffusion sheet OS1 may diffuse the light. The prism sheet OS2 may collect the light so that a traveling direction of the light diffused by the diffusion sheet OS1 is close to a normal line direction (e.g., close to substantially the normal line direction) of the display panel DP. The protection sheet OS3 may protect the prism sheet OS2 from an external impact. In the current embodiment, although the optical sheet OS includes one diffusion sheet OS1, one prism sheet OS2, and one protection sheet OS3, the present disclosure will not be limited thereto. For example, in another embodiment of the present disclosure, plural sheets of at least one selected from diffusion sheet OS1, the prism sheet OS2, and the protection sheet OS3 may overlap (e.g., substantially overlap) each other to constitute the optical sheets OS. As occasion demands, or as is desired, one or more sheets (e.g., the optical sheets) may be omitted.

A reflection sheet RS may be disposed between the light guide plate LGP and the bottom chassis BC. The reflection sheet RS may reflect the light leaking from the light guide plate LGP to allow the light to be incident again into the light guide plate LGP. However, in another embodiment of the present disclosure, the reflection sheet RS may be omitted. For example, a light-reflective material may be applied on the bottom chassis BC to function as the reflection sheet RS. In some embodiments, the bottom chassis BC is made of a light-reflective material. The light-reflective material will not be limited to any specific material, and may be any suitable material generally available in the art.

Figure 2:
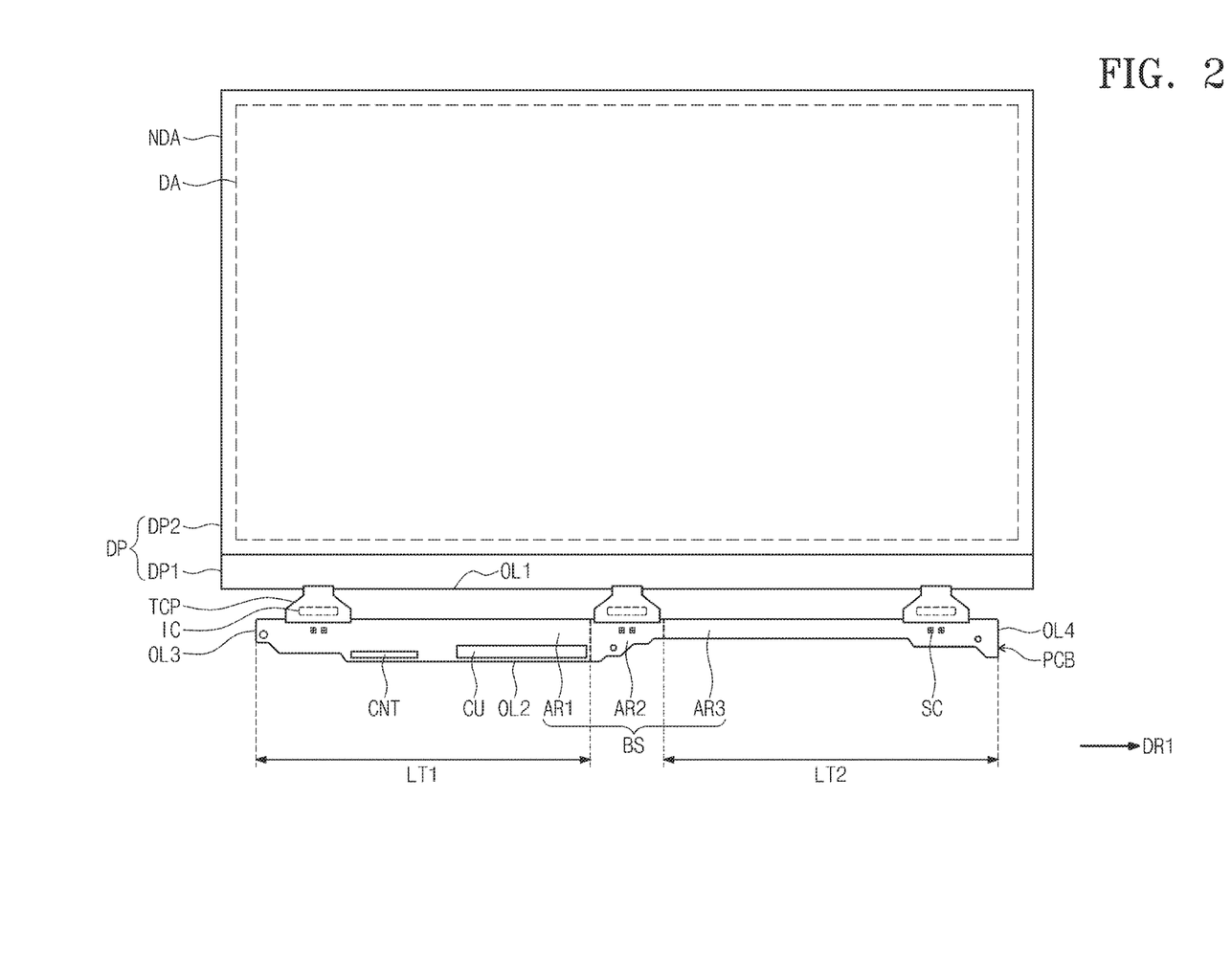
FIG. 2 is a plan view illustrating a portion of the display device according to an embodiment of the present disclosure.
Figure 3:
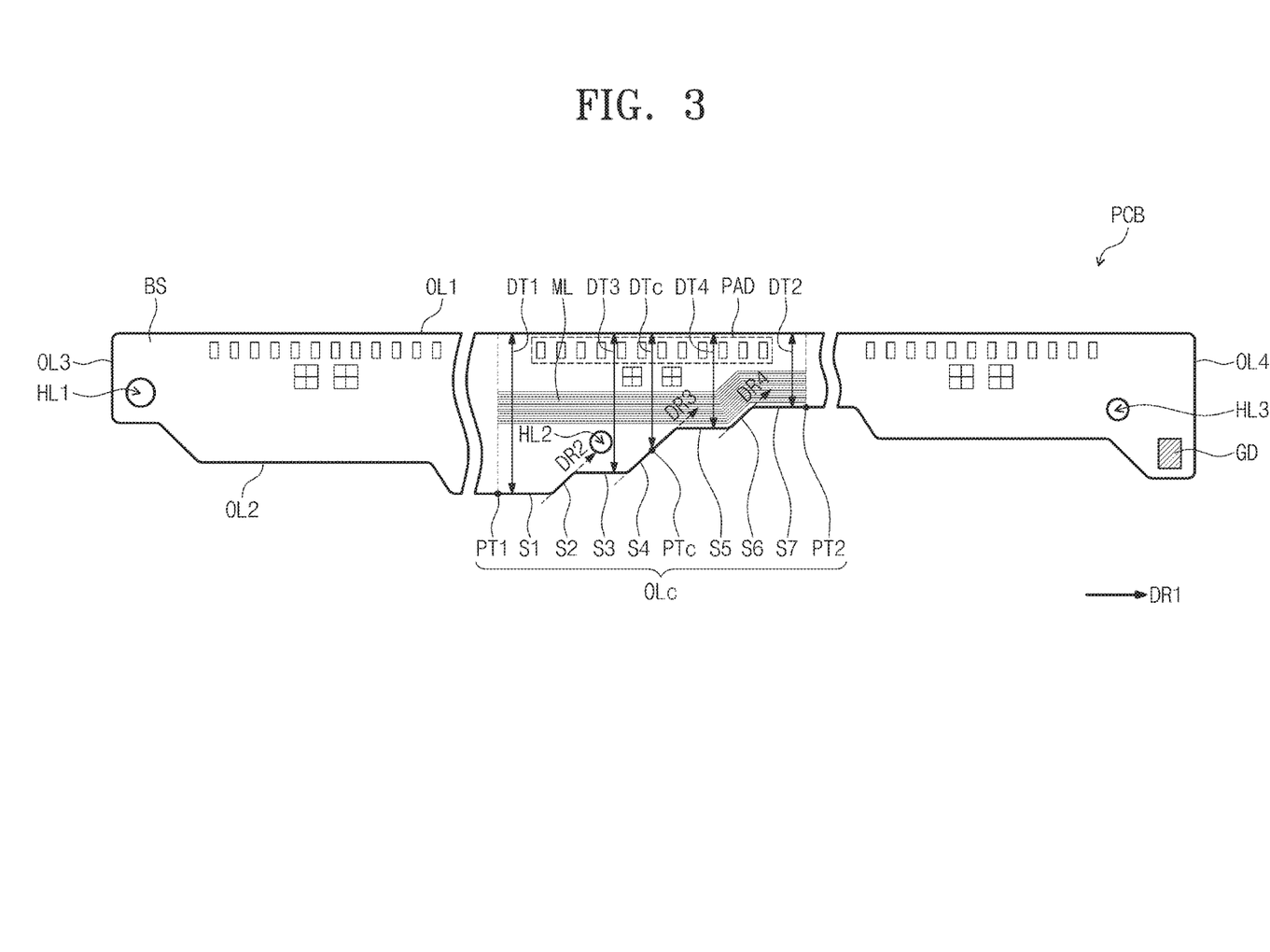
FIG. 3 is a plan view of a printed circuit board according to an embodiment of the present disclosure.

FIG. 2 is a plan view illustrating a portion of the display device according to an embodiment of the present disclosure, and FIG. 3 is a plan view of a printed circuit board according to an embodiment of the present disclosure.

Referring to FIGS. 2 and 3, the printed circuit board PCB may include a base substrate BS, a pad part PAD, a control part CU, a line ML, and a connector CNT.

The base substrate BS may include a first outline OL1, a second outline OL2, a third outline OL3, and a fourth outline OL4. When the base substrate BS is viewed from a thickness direction, the first, second, third, and fourth outlines OL1, OL2, OL3, and OL4 may define an edge of the base substrate BS.

The first outline OL1 extends in a first direction DR1. The second outline OL2 faces the first outline OL1. Each of the third and fourth outlines OL3 and OL4 may couple (e.g., connect) the first outline OL1 to the second outline OL2. The third outline OL3 faces the fourth outline OL4.

A first area AR1, a second area AR2, and a third area AR3 may be successively defined on the base substrate BS in the first direction DR1. A first width LT1 of the first area AR1 in the first direction DR1 may be the same (e.g., substantially the same) as a second width LT2 of the third area AR3 in the first direction DR1.

A line of the second outline OL2 overlapping the second area AR2 may be defined as a central outline OLc. The central outline OLc may include a first point PT1, a second point PT2, a first side S1, a second side S2, a third side S3, a fourth side S4, a fifth side S5, a sixth side S6, and a seventh side S7.

The first point PT1 may refer to a point contacting the first area AR1 (e.g., a point at an interface between the first area AR1 and the second area AR2), and the second point PT2 may refer to a point contacting the third area AR3 (e.g., a point at an interface between the second area AR2 and the third area AR3). A distance between the first point PT1 and the first outline OL1 is greater than that between the second point PT2 and the first outline OL1. The central outline OLc may have a stepped shape that gradually decreases in distance between the central outline OLc and the first outline OL1 from the first point PT1 to the second point PT2.

The first side S1 extends from the first point PT1 in the first direction DR1. The second side S2 extends from the first side S1 in a second direction DR2 approaching (e.g., toward) the first outline OL1. The third side S3 extends from the second side S2 in the first direction DR1. The fourth side S4 extends from the third side S3 in a third direction DR3 approaching (e.g., toward) the first outline OL1. The fifth side S5 extends from the fourth side S4 in the first direction DR1. The sixth side S6 extends from the fifth side S5 in a fourth direction approaching (e.g., toward) the first outline OL1. The seventh side S7 extends from the sixth side S6 toward the second point PT2 in the first direction DR1.

Each of the second, third, and fourth directions DR2, DR3, and DR4 may cross the first direction DR1. For example, an angle between the first direction DR1 and a respective one of the second, third, and fourth directions DR2, DR3, and DR4 may be less than about 90°.

The second direction DR2 may be aligned (e.g., substantially aligned) with the fourth direction DR4. Thus, the second side S2 extending in the second direction DR2 may be parallel (e.g., substantially parallel) with the sixth side S6 extending in the fourth direction DR4.

In FIG. 3, although it is exemplarily illustrated that the third direction DR3 is aligned (e.g., substantially aligned) with the second direction DR2, the third direction DR3 may not be aligned with the second direction DR2. Also, although it is exemplarily described that the third direction DR3 and the first direction DR1 forms an acute angle of about 90° or less, the present disclosure will not be limited thereto. For example, in another embodiment of the present disclosure, the third direction DR3 may be perpendicular (e.g., substantially perpendicular) to the first direction DR1.

The second outline OL2 may have a point symmetrical shape with respect to a central point PTc that is a center of the fourth side S4. For example, when half of the second outline OL2 is rotated at about 180° with respect to the central point PTc, the half of the second outline OL2 may overlap (e.g., substantially overlap) the other half of the second outline OL2. Thus, the printed circuit board PCB may have a shape that is engaged with a printed circuit board having a shape that the printed circuit board PCB is rotated at about 180°.

The sum of a first distance DT1 between the first outline OL1 and the side S1 and a second distance DT2 between the first outline OL1 and the seventh side S7 may be the same (e.g., substantially the same) as that of a third distance DT3 between the first outline OL1 and the third side S3 and a fourth distance DT4 between the first outline OL1 and the firth side S5.

The sum of a set distance (e.g., the minimum distance) between the first outline OL1 and the second outline OL2 and a set distance (e.g., the maximum distance) between the first outline OL1 and the second outline OL2 may be twice a distance DTc between the central point PTc and the first outline OL1. For example, in FIG. 3, the sum of the first distance DT1 which is the maximum distance between the first outline OL1 and the second outline OL2 and the second distance DT2 which is the minimum distance between the first outline OL1 and the second outline OL2 may be twice the distance DTc between the central point PTc and the first outline OL1.

The pad part PAD may be disposed adjacent to the first outline OL1. The pad part PAD may have a plurality of pads arranged in the first direction DR1. The tape carrier package TCP may be attached to the pad part PAD. The tape carrier package TCP may be attached to the pad part PAD and cover a portion of the first outline OL1. The tape carrier package TCP may electrically couple (e.g., electrically connect) the display panel DP to the printed circuit board PCB.

In the current embodiment, three pad parts PADs provided on the base substrate BS are exemplarily illustrated. However, the number of the pad part PAD may not be limited thereto. For example, more or less than three pad parts PADs may be provided. In some embodiments, the pad part PAD may be provided in odd numbers. Thus, at least one of the pad parts PAD may be disposed on the second area AR2.

The connector CNT and the control part CU may be disposed on the first area AR1. The connector CNT may receive a signal from the outside. The control part CU may receive image signals inputted from the outside and change formats of the image signals to correspond to interface specifications and driving modes of a data driver, thereby generating an image data. The control part CU may output image data and a control signal. The image data and the control signal generated from the control part CU may be outputted to the pad part PAD through the line ML disposed on the printed circuit board PCB and provided to the driving chip IC. In FIG. 3, for the convenience of description, only the portion of the line ML disposed on the second area AR2 is illustrated. Each of the fifth, sixth, and seventh sides S5, S6, and S7 may have a shape corresponding to an arrangement of the line ML.

A stabilization part SC may be disposed on a front end of the pad part PAD. The stabilization part SC may stabilize the image data and the control signal outputted through the pad part PAD. For example, the stabilization part SC may include an element such as, for example, a capacitor. However, the stabilization part SC is provided as an example and the present disclosure is not limited to the above-described structure. For example, the stabilization part SC may be omitted.

The printed circuit board PCB may be coupled to a portion of a structure of the display device (see reference symbol "DD" of FIG. 1) such as, for example, the bottom chassis (see reference symbol "BC" of FIG. 1) after final assembly. For example, first to third holes HL1, HL2, and HL3 may be defined in the first, second, and third areas AR1, AR2, and AR3, respectively, of the printed circuit board PCB. The printed circuit board PCB may be coupled to a portion of the structure of the display device (see reference symbol "DD" of FIG. 1) by a screw passing through one of the first to third holes HL1, HL2, and HL3. However, the printed circuit board PCB will not be limited to the above-described structure. For example, the first to third holes HL1, HL2, and HL3 may be fitted and coupled to respective protrusions protruding from a portion of the structure of the display device (see reference symbol "DD" of FIG. 1).

The second hole HL2 may be defined between the third side S3 and the first outline OL1 of the second area AR2. However, in another embodiment of the present disclosure, the first to third holes HL1, HL2, and HL3 may not be provided.

A ground electrode GD may be disposed on the third area AR3. The ground electrode GD may allow the printed circuit board PCB to be grounded. The ground electrode GD may contact the bottom chassis (see reference symbol "BC" of FIG. 1) or a shield case of the display device (see reference symbol "DD" of FIG. 1). The ground electrode GD may be disposed on various suitable positions and have various suitable shapes. Also, the ground electrode GD may be omitted.

Figure 4:
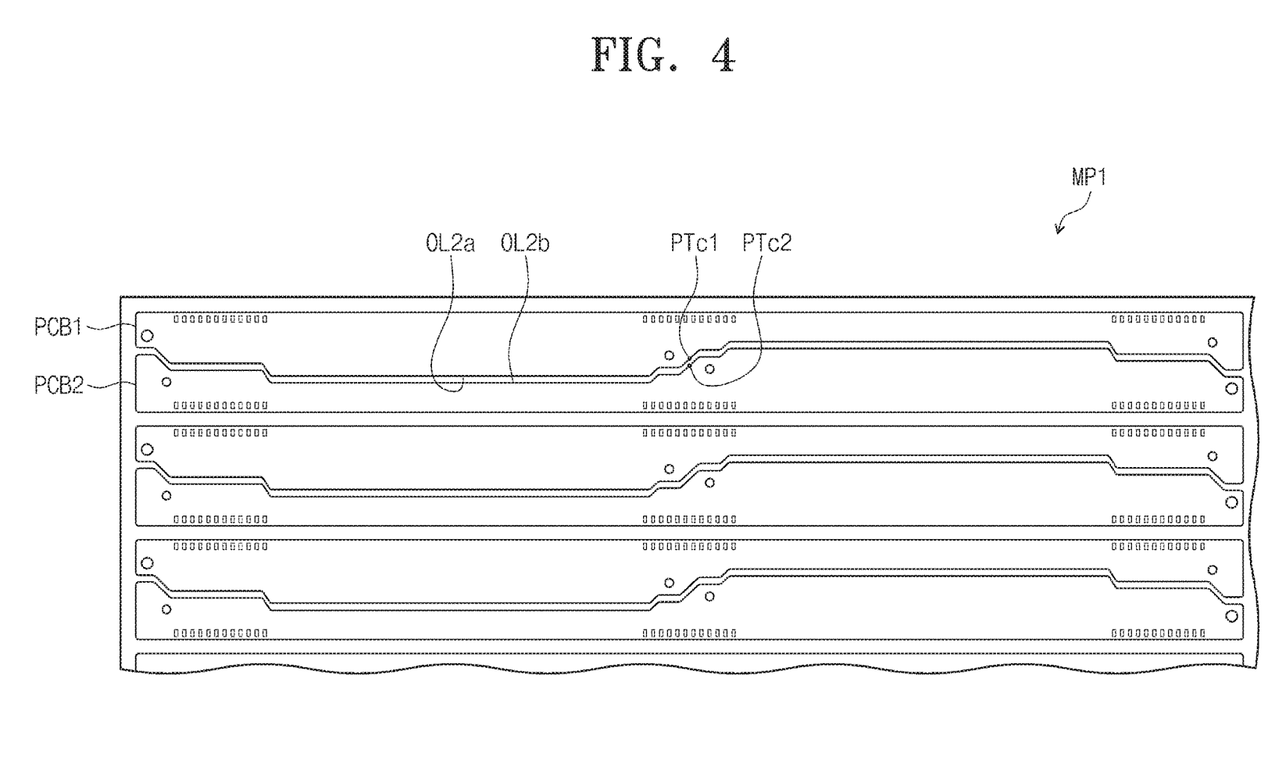
FIG. 4 is a plan view of a base plate according to an embodiment of the present disclosure.

FIG. 4 is a plan view of a base plate according to an embodiment of the present disclosure.

Referring to FIG. 4, FIG. 4 is a plan view illustrating a base plate MP1 before the first and second printed circuit boards PCB1 and PCB2 are separated.

Each of the first and second printed circuit boards PCB1 and PCB2 may have an edge having the same (e.g., substantially the same) shape as that of the above-described printed circuit board (see reference symbol PCB of FIG. 3). Each of the first and second printed circuit boards PCB1 and PCB2 may be in a state where a pad part PAD and a line are disposed thereon, and electrical elements such as a capacitor, a resistor, and a semiconductor chip are not mounted thereon.

Similar to the above description of FIG. 3, second outlines OL2a and OL2b have a point symmetrical shape with respect to central points PTc1 and PTc2, respectively. Thus, the second outline OL2a of the first printed circuit board PCB1 may have a shape that is engaged with the second outline OL2b of the second printed circuit board PCB2. For example, the second outline OL2a of the first printed circuit board PCB1 may have a shape that corresponds to the second outline OL2b of the second printed circuit board PCB2. The first printed circuit board PCB1 and the second printed circuit board PCB2 having a shape that the first printed circuit board PCB1 is rotated at about 180° may be repeatedly produced.

When the second outline OL2a of the first printed circuit board PCB1 is disposed to face the second outline OL2b of the second printed circuit board PCB2, the first and second printed circuit boards PCB1 and PCB2 may together have a rectangular outer edge.

According to the current embodiment, the first and second printed circuit boards PCB1 and PCB2 may be alternately arranged. Thus, unlike the existing technology in which only one of the first printed circuit boards PCB1 and the second printed circuit boards PCB2 are arranged, the waste of the base plate MP1 may be reduced. As a result, more numbers of printed circuit boards may be produced from the base plate MP1.

Figure 5:
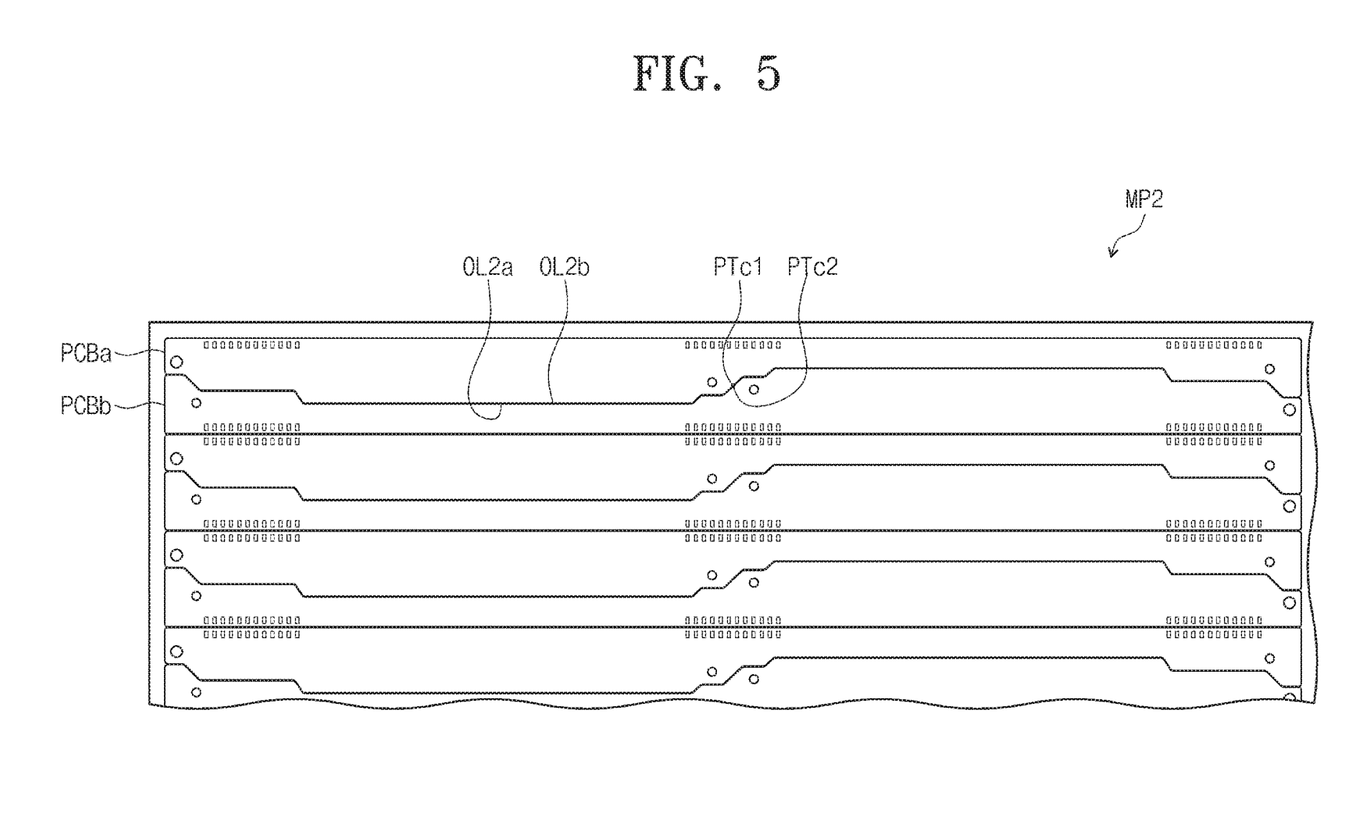
FIG. 5 is a plan view of a base plate according to another embodiment of the present disclosure.

FIG. 5 is a plan view of a base plate according to another embodiment of the present disclosure.

Referring to FIG. 5, a gap between the first printed circuit board PCBa and the second printed circuit board PCBb is different from that between the first and second printed circuit boards PCB1 and PCB2 in FIG. 4.

In FIG. 4, the first printed circuit board PCB1 is disposed to be spaced a set (e.g., predetermined) distance apart from the second printed circuit board PCB2. However, in FIG. 5, the first printed circuit board PCBa and the second printed circuit board PCBb are arranged without (e.g., substantially without) a gap therebetween.

According to FIG. 5, by performing cutting once, the second outline OL2a of the first printed circuit board PCBa and the second outline OL2b of the second printed circuit board PCBb may be concurrently (e.g., simultaneously) formed. Also, since the first and second printed circuit boards PCBa and PCBb are arranged without (e.g., substantially without) a gap therebetween, the waste of the base plate MP2 may be minimized or reduced.

Figure 6:
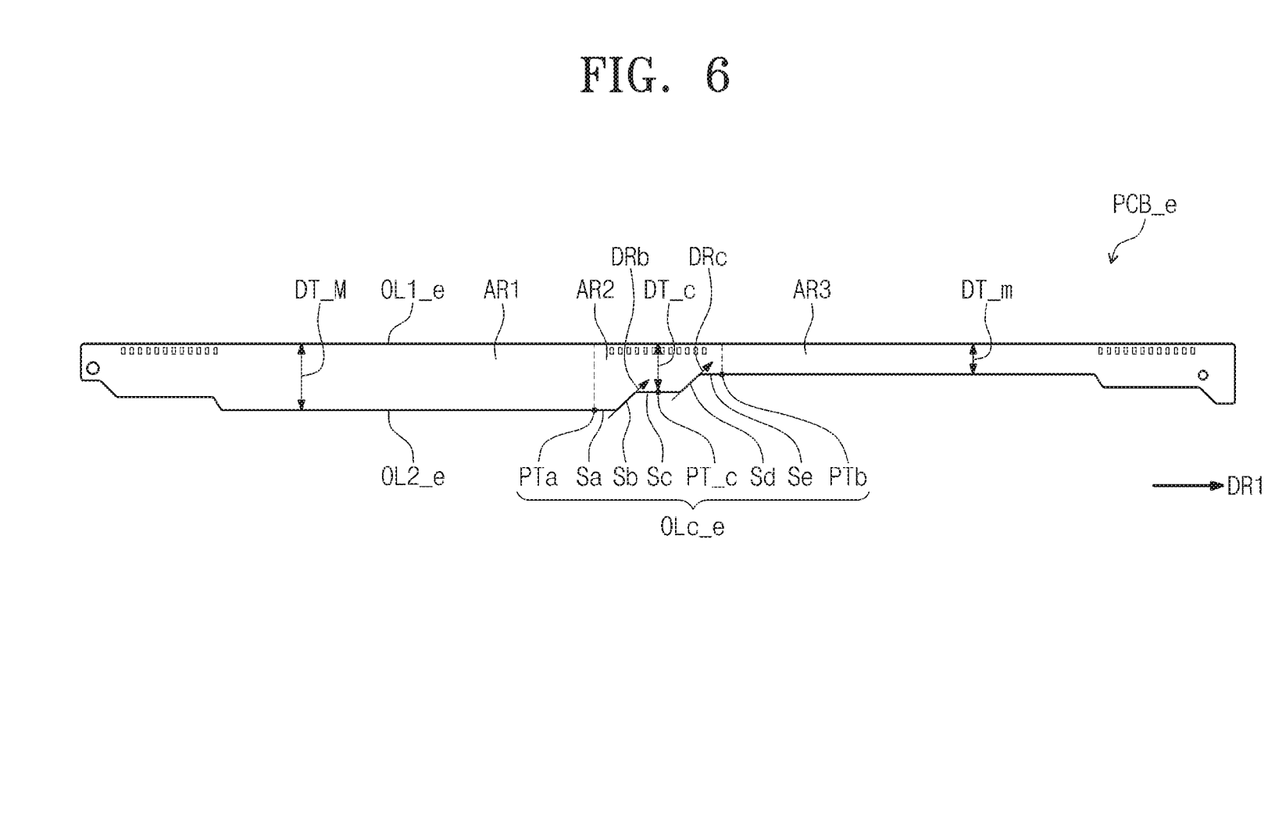
FIG. 6 is a plan view of a printed circuit board according to another embodiment of the present disclosure.

FIG. 6 is a plan view of a printed circuit board according to another embodiment of the present disclosure.

A printed circuit board PCB_e of FIG. 6 has a difference in shape of a central outline OLc_e when compared to that of the printed circuit board PCB in FIG. 3. The central outline OLc_e refers to a portion of a second outline OL2_e overlapping the second area AR2.

The central outline OLc_e may include a first point PTa, a second point PTb, a first side Sa, a second side Sb, a third side Sc, a fourth side Sd, and a fifth side Se.

The first point PTa may refer to a point that is in contact with the first area AR1 (e.g., a point at an interface between the first area AR1 and the second area AR2), and the second point PTb may refer to a point that is in contact with the third area AR3 (e.g., a point at an interface between the second area AR2 and the third area AR3). A distance between the first point PTa and the first outline OL1_e is greater than that between the second point PTb and the first outline OL1_e. The central outline OLc_e may have a stepped shape that gradually decreases in distance between the central outline OLc_e and the first outline OL1_e from the first point PTa to the second point PTb.

The first side Sa extends from the first point PTa in the first direction DR1. The second side Sb extends from the first side Sa in a second direction DRb approaching (e.g., toward) the first outline OL1_e. The third side Sc extends from the second side Sb in the first direction DR1. The fourth side Sd extends from the third side Sc in a third direction DRc approaching (e.g., toward) the first outline OL1_e. The fifth side Se extends from the fourth side Sd in the first direction DR1.

Each of the second and third directions DRb and DRc may cross the first direction DR1. For example, an angle between the first direction DR1 and a respective one of the second and third directions DRb and DRc may be less than about 90°. The second direction DRb may be aligned (e.g., substantially aligned) with the third direction DRc. Thus, the second side Sb extending in the second direction DRb may be parallel (e.g., substantially parallel) with the fourth side Sd extending in the third direction DRc.

The sum of the minimum distance DT_m between the first outline OL1_e and the second outline OL2_e and the maximum distance DT_M between the first outline OL1_e and the second outline OL2_e may be twice a distance DT_c between the central point PT_c and the first outline OL1_e.

The second outline OL2_e may have a point symmetrical shape with respect to the central point PT_c that is the center of the third side Sc. For example, when half of the second outline OL2_e is rotated at about 180°, the half of the second outline OL2_e may overlap (e.g., substantially overlap) the other half of the second outline OL2_e. Thus, the printed circuit board PCB_e may have a shape that is engaged with a printed circuit board having a shape that the printed circuit board PCB_e is rotated at about 180° with the second outline OL2_e therebetween. Therefore, the printed circuit board PCB_e and the printed circuit board having a shape that the printed circuit board PCB_e is rotated at about 180° may face each other with the second outline OL2_e therebetween and together have a rectangular shape.

It will be understood that, although the terms "first," "second," "third," etc., may be used herein to describe various elements, components, regions, layers and/or sections (e.g., a "first substrate" or a "second substrate"), these elements, components, regions, layers and/or sections should not be limited by these terms. These terms are used to distinguish one element, component, region, layer or section from another element, component, region, layer or section. Thus, a first element, component, region, layer or section described herein could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. For example, the middle frame MF may be above the display panel DP even though the MF is described herein as being disposed under the display panel DP. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. For example, as described herein, the polarization plates may be directly or indirectly on the respective upper and lower portions of the display panel DP. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The subject matter disclosed herein is to be considered illustrative and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A printed circuit board comprising:
   a base substrate comprising a first outline that extends in a first direction and a second outline facing the first outline, the base substrate having a first area, a second area, and a third area successively defined thereon in the first direction,
   wherein a central outline of the second outline which overlaps the second area has a stepped shape that gradually decreases in distance between the central outline and the first outline from a first point of the central outline contacting the first area to a second point of the central outline contacting the third area, and
   wherein the central outline comprises:
   a first side extending from the first point in the first direction;
   a second side extending from the first side in a second direction approaching the first outline;
   a third side extending from the second side in the first direction; and
   a fourth side extending from the third side in a third direction approaching the first outline.

2. The printed circuit board of claim 1, wherein a first width that is in parallel with the first direction on the first area is equal to a second width that is in parallel with the first direction on the third area.

3. The printed circuit board of claim 1, wherein the central outline further comprises:
   a fifth side extending from the fourth side toward the second point in the first direction.

4. The printed circuit board of claim 3, wherein the second outline has a point symmetrical shape with respect to a central point that is a center of the third side.

5. The printed circuit board of claim 4, wherein a sum of a minimum distance between the first outline and the second outline and a maximum distance between the first outline and the second outline is twice a distance between the central point and the first outline.

6. The printed circuit board of claim 1, further comprising a pad part disposed on the second area.

7. A printed circuit board comprising:
   a base substrate comprising a first outline that extends in a first direction and a second outline facing the first outline, the base substrate having a first area, a second area, and a third area successively defined thereon in the first direction,
   wherein a central outline of the second outline which overlaps the second area has a stepped shape that gradually decreases in distance between the central outline and the first outline from a first point of the central outline contacting the first area to a second point of the central outline contacting the third area,
   wherein the central outline comprises:
   a first side extending from the first point in the first direction;
   a second side extending from the first side in a second direction approaching the first outline;
   a third side extending from the second side in the first direction;
   a fourth side extending from the third side in a third direction approaching the first outline;
   a fifth side extending from the fourth side in the first direction;
   a sixth side extending from the fifth side in a fourth direction approaching the first outline; and
   a seventh side extending from the sixth side toward the second point in the first direction.

8. The printed circuit board of claim 7, wherein the second direction is aligned with the fourth direction.

9. The printed circuit board of claim 7, wherein a sum of a first distance between the first side and the first outline and a second distance between the seventh side and the first outline is equal to that of a third distance between the third side and the first outline and a fourth distance between the fifth side and the first outline.

10. The printed circuit board of claim 7, wherein the second outline has a point symmetric shape with respect to a central point that is a center of the fourth side.

11. The printed circuit board of claim 10, wherein the base substrate further comprises:
    a third outline coupling the first outline to the second outline; and
    a fourth outline facing the third outline to couple the first outline to the second outline,
    wherein a distance between the central point and the third outline is equal to that between the central point and the fourth outline.

12. The printed circuit board of claim 10, wherein a sum of a minimum distance between the first outline and the second outline and a maximum distance between the first outline and the second outline is twice a distance between the central point and the first outline.

13. The printed circuit board of claim 7, wherein a hole is defined between the third side and the first outline of the base substrate.

14. A display device comprising:
a display panel configured to display an image;
a printed circuit board comprising a first outline that extends in a first direction and a second outline that faces the first outline, the printed circuit board having a first area, a second area, and a third area successively defined thereon in the first direction; and
a plurality of tape carrier packages configured to cover a portion of the first outline, the plurality of tape carrier packages electrically coupling the printed circuit board to the display panel,
wherein a central outline of the second outline which overlaps the second area has a stepped shape that gradually decreases in distance between the central outline and the first outline from a first point of the central outline contacting the first area to a second point of the central outline contacting the third area, and
wherein the central outline comprises:
a first side extending from the first point in the first direction;
a second side extending from the first side in a second direction approaching the first outline;
a third side extending from the second side in the first direction; and
a fourth side extending from the third side in a third direction approaching the first outline.

15. The display device of claim 14, wherein the plurality of tape carrier packages are provided in odd numbers, and
at least one of the plurality of tape carrier packages is attached to the second area of the printed circuit board.

16. The display device of claim 14, wherein the central outline further comprises:
a fifth side extending from the fourth side in the first direction;
a sixth side extending from the fifth side in a fourth direction approaching the first outline; and
a seventh side extending from the sixth side toward the second point in the first direction.

17. The display device of claim 16, wherein the second outline has a point symmetrical shape with respect to a central point that is a center of the fourth side.

18. The display device of claim 17, wherein a sum of a minimum distance between the first outline and the second outline and a maximum distance between the first outline and the second outline is twice a distance between the central point and the first outline.

19. The display device of claim 14, further comprising a driving chip disposed on one surface of each of the plurality of tape carrier packages, and
wherein the printed circuit board further comprises a control part disposed on the first area to generate a control signal for driving the driving chip.

* * * * *